United States Patent [19]
Watanabe

[11] Patent Number: 6,162,567
[45] Date of Patent: Dec. 19, 2000

[54] PROCESS FOR PRODUCING HALFTONE MASK

[75] Inventor: Kunio Watanabe, Tenri, Japan

[73] Assignee: Sharp Kabushiki Kaisha, Osaka, Japan

[21] Appl. No.: 09/372,089

[22] Filed: Aug. 11, 1999

[30] Foreign Application Priority Data

Aug. 31, 1998 [JP] Japan .................................. 10-244265

[51] Int. Cl.[7] ...................................................... G03F 9/00
[52] U.S. Cl. .............................. 430/5; 430/296; 430/320; 430/942
[58] Field of Search ................................ 430/5, 296, 320, 430/942

*Primary Examiner*—Christopher G. Young
*Attorney, Agent, or Firm*—Nixon & Vanderhye

[57] ABSTRACT

A process for producing a halftone mask comprises the steps of: (a) forming an electron beam resist film on a mask blank which includes a translucent film and a light-block film sequentially formed on a transparent substrate; (b) irradiating an electron beam to the electron beam resist film in such a dose that the electron beam resist film remains in a predetermined thickness by development in a first write area and is completely removed by development in a second write area; (c) developing the electron beam resist film thereby to form an electron beam resist film retaining the predetermined thickness in the first write area and having an opening in the second write area; (d) patterning the light-block film using the resulting electron beam resist film as a mask; (e) ashing the electron beam resist film to remove the electron beam resist film from the first write area completely; (f) patterning the translucent film using the patterned light-block film as a mask; and (g) patterning the light-block film using the resulting electron beam resist film as a mask.

11 Claims, 2 Drawing Sheets

PROCESS FOR PRODUCING HALFTONE MASK

CROSS-REFERENCE TO RELATED APPLICATION

This application is related to Japanese application No. HEI 10(1998)-244265 filed on Aug. 31, 1998, whose priority is claimed under 35 USC § 119, the disclosure of which is incorporated by reference in its entirety.

BACKGROUND OF THE INVENTION

1. Field of the Invention

The present invention relates to a process for producing a halftone mask, more particularly, to a process for producing a halftone mask comprising a transparent substrate, a translucent film and a light-block film. The process enables an easy and secure patterning of the translucent film.

2. Description of Related Art

Generally, a halftone mask have a film of molybdenum silicide as a translucent film which provides halftone and a film of chromium as a light-block film which are laminated in desired patterns on a transparent substrate typically made of quartz.

Where a halftone mask as described above is to be used as a mask for a KrF excimer exposure, the molybdenum silicide film and the chromium film are formed to be about 93 nm and about 70 nm thick, respectively.

Such a halftone mask is conventionally produced by the following process in association with FIGS. 2(a) to 2(g).

As shown in FIG. 2(a), a film 22 of molybdenum silicide having a thickness of 93 nm and a film 23 of chromium having a thickness of 70 nm are sequentially formed on a substrate 21 of quartz by a vacuum deposition method or a sputtering method. Further an electron beam (EB) resist film 24 is formed thereon to be about 450 to about 550 nm thick by a spin-on coating method. An electron beam is irradiated to the resulting resist film 24. This electron beam irradiation is performed separately on a first write area 24a where the resist film will remain in a predetermined thickness by developed and on a second write area 24b where the resist film will be completely removed by being developed, for the purpose of enhancing the alignment of a pattern on the light-block film and a pattern on the translucent film and minimizing the number of steps in EB writing.

Subsequently, as shown in FIG. 2(b), the EB-irradiated resist film 24 is developed to form a resist film 24 patterned to have the first write area 24a and the second write area 24b.

Thereafter, as shown in FIG. 2(c), the exposed chromium film 23 is dry-etched with a $CCl_4+O_2$ gas plasma using the resist film 24 as a mask.

Then, as shown in FIG. 2(d), the exposed molybdenum silicide film 22 is dry-etched with a $CF_4+O_2+N_2$ gas plasma.

Next, as shown in FIG. 2(e), the resist film 24 is ashed with an $O_2$ plasma to remove the resist film 24 in the first write area 24a.

Subsequently, as shown in FIG. 2(f), the exposed chromium film 23 is wet-etched with a mixed liquid of ammonium cerium (IV) nitrate and perchloric acid using the resulting resist film 24 as a mask.

Lastly, as shown in FIG. 2(g), the remaining resist film 24 is removed by being immersed in dimethylformamide, acetone, and an aqueous solution of sulfuric acid and hydrogen peroxide sequentially.

However, in the above-described process for producing a halftone mask, the ashing rate is not stable when the resist film 24 is ashed with $O_2$, and therefore, the resist film 24 may sometimes remain in the first write area 24a. The reason why the ashing rate is unstable is that the resistance of the resist film 24 to ashing becomes high due to the dry etching of the molybdenum silicide film 22 with the $CF_4+O_2+N_2$ gas plasma before the resist film 24 is ashed and thereby the ashing rate at the $O_2$ plasma ashing decreases.

This defective patterning of the resist film 24 by ashing brings about an inaccurate patterning of the molybdenum silicide film 22 in a later step. Thus there is a problem that the production yield of halftone masks is considerably low.

SUMMARY OF THE INVENTION

The present invention provides a process for producing a halftone mask comprising the steps of (a) forming an electron beam resist film on a mask blank which includes a translucent film and a light-block film sequentially formed on a transparent substrate, (b) irradiating an electron beam to the electron beam resist film in such a dose that the electron beam resist film will remain in a predetermined thickness by development in a first write area and will be completely removed by development in a second write area, (c) developing the electron beam resist film thereby to form an electron beam resist film retaining the predetermined thickness in the first write area and having an opening in the second write area, (d) patterning the light-block film using the resulting electron beam resist film as a mask, (e) ashing the electron beam resist film to remove the electron beam resist film from the first write area completely, (f) patterning the translucent film using the patterned light-block film as a mask, and (g) patterning the light-block film using the resulting electron beam resist film as a mask.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
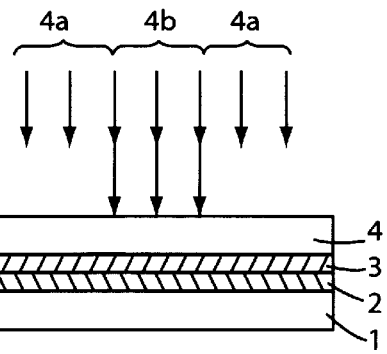
FIGS. 1(a) to 1(g) are schematic sectional views illustrating a process for producing a halftone mask in accordance with the present invention.
Figure 1:
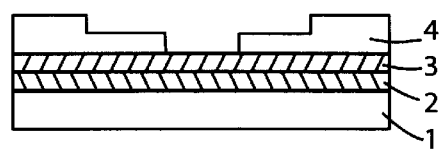
Figure 1:
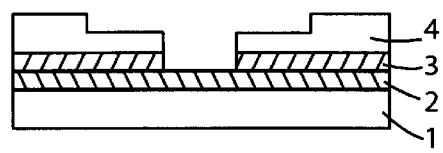
Figure 1:
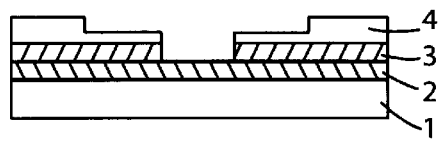
Figure 1:
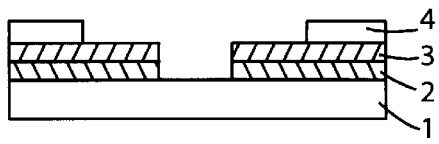
Figure 1:
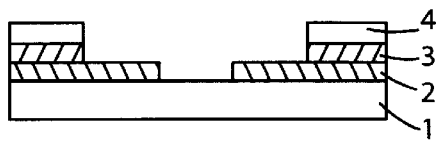
Figure 1:
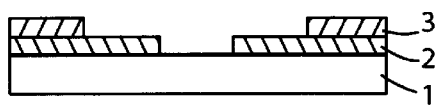
Figure 2:
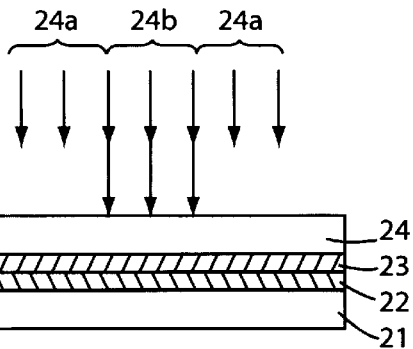
FIGS. 2(a) to 2(g) are schematic sectional views illustrating the conventional process for producing a halftone mask.
Figure 2:
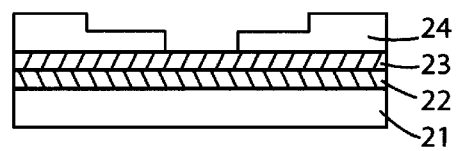
Figure 2:
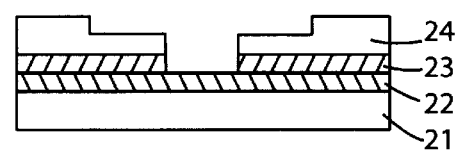
Figure 2:
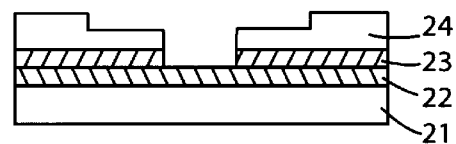
Figure 2:
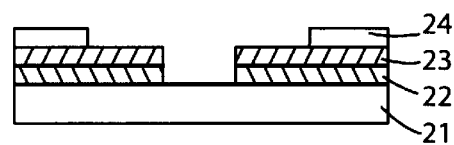
Figure 2:
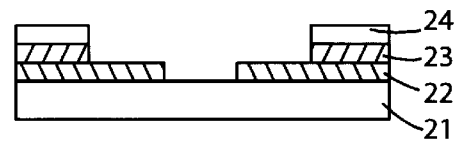
Figure 2:
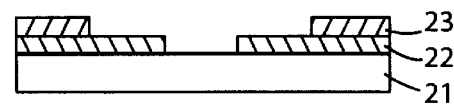

In the present invention, a mask blank composed of a transparent substrate and a laminate of a translucent film and a light-block film sequentially formed on the substrate is used in step (a).

As the transparent substrate, a substrate of quartz is typically used, but any transparent substrate of glass, plastic (polyimides, polyamides, liquid crystal polyarylates, polyethylene terephthalate(PET), polyetheretherketone(PEEK), polyethersulfone(PES), polyethernitrile(PEN), polyester, polycarbonate, polyarylates, polysulfone, polyetherimide and the like) or the like may be used without a particular restriction.

For the translucent film, molybdenum silicide is typically used in a thickness of about 90 nm to about 100 nm, but a silicide of a high-melting metal such as titanium, tantalum and tungsten may be used in such a thickness that light transmittance is about 40% to about 60%. The translucent film may be formed by a known method such as a sputtering method, a vacuum evaporation method, a CVD method, a MOCVD method, a sol-gel method or the like, or a combination thereof.

For the light-block film, chromium is typically used in a thickness of about 60 nm to about 70 nm, but a metal such as aluminum, copper, iron oxide, nickel, silicon, germanium oxide and the like may be used in such thickness that light is hardly passed through. The light-block film may be formed by a known method such as a sputtering method, a vacuum evaporation method or the like, or a combination thereof.

An electron beam resist film which is formed on the mask blank is not particularly limited provided that it is a resist film usually used for electron beam exposure. For example, usable are both positive type resist films of polymethyl methacrylate, polybutylene sulfone, polyhexafluorobutyl methacrylate, a mixture of novolak—polymethylpentene sulfone and the like, and negative type resist films of polyglycidyl methacrylate, polyglycidyl methacrylate-ethylacrylate copolymer, chloromethylated polystyrene, iodinated polystyrene and the like, among which positive type electron beam resist films are preferred. Suitably the resist film is used in a thickness of about 30 to about 60 nm, preferably about 450 nm to about 550 nm. The resist film may be formed by a known method such as a spin coating method.

Subsequently, in step (b), an electron beam is irradiated to the electron beam resist film at such a dose that in the first write area, the electron beam resist film of a predetermined thickness will remain after development and in the second write area, the electron beam resist film will be completely removed by the development. The dose here signifies an amount of charge ($C/cm^2$) produced by the electron beam per unit area and it varies depending upon the acceleration voltage of the electron beam. For the electron beam irradiation at this step, any of a Gaussian beam, a fixed shaped beam and a variable shaped beam may be used. Either a raster scan method or a vector method may be used for scanning. Further, either a step & repeat move system or a continuous move system may be used for moving a sample. The dose of the electron beam may be adjusted as required depending on the kind of the resist film, its thickness and the kind of the electron beam. For example, with the kind and thickness of the resist film within the above-mentioned range, the electron beam is irradiated at a dose of about 1.0 to about 1.8 in the first write area and at a dose of about 2.0 to about 3.6 in the second write area, when the acceleration voltage may about 10 keV. Thereby, when the resist film is developed in a later step, the resist film is completely removed from the second write area, while the resist film is maintained in about 20% to about 80%, preferably 20% or more and 80% or less, more preferably 40% to 60%, of its original thickness in the first write area. The electron beam irradiation may be carried out only on the second write area at a high dose first, and then only on the first write area at a low dose. It may also be carried out reversely. Or the first and second write area may be scanned with an electron beam continuously write changing the dose. Alternatively, the first and second write areas may be scanned with an electron beam at a fixed dose and the second write area may be scanned again with an electron beam at an appropriate dose.

In step (c), the resulting electron beam resist film is developed. This development may be performed by a known process depending on the kind of the resist film used. By the development, an electron beam resist film is formed to exist in a predetermined thickness in the first write area and have an opening in the second write area.

In step (d), using the resulting electron beam resist film as a mask, the light-block film is patterned. The way of patterning at this step may be selected as appropriate depending on the kind of the light-block film, but it is preferably to select an etching method and etching conditions so that the etching rate of the light-block film is larger than that of the translucent film. For example, dry etching methods such as a plasma enhanced etching, a RIE method and a photoexcitation etching method may be mentioned, among which the RIE method is preferred. As a suitable etching gas for these etching methods, at least one gas may be selected for use from $CCl_4$, $CH_2Cl_2$, $SiCl_4$, $BCl_4$, $Cl_2$ etc. and a mixture gas of at least one of the mentioned above and oxygen gas.

In step (e), the electron beam resist film is ashed. This ashing is so conducted that the electron beam resist film in the first write area is completely removed. For example, the ashing may be performed by a plasma enhanced etching method or an RIE method using oxygen or ozone gas and, if appropriate, using $N_2$, $CF_4$, $H_2O$ and/or the like.

In step (f), the translucent film is patterned using the patterned light-block film as a mask. In this etching step, it is preferable to select an etching method and etching conditions so that the etching rate of the translucent film is larger than that of the light-block film. Examples of etching methods include a plasma etching method, a RIE method and a photoexcited etching, among which the RIE method is preferred. As a suitable etching gas for these etching methods, at least one gas may be selected for use from $CH_2F_2$, $CF_4$, $NF_3$ etc. and a mixture gas of at least one of the mentioned above with oxygen gas and/or nitrogen gas.

In step (g), the light-block film is patterned using the resulting electron beam resist film as a mask. The patterning at this step may be performed by any of the above-mentioned dry etching methods and wet etching methods, among which the wet etching methods are preferred. An etchant used for the wet etching method may be selected as appropriate depending on the kind of the light-block film, but it is preferable to select such an etchant that the etching rate of the light-block film is larger than that of the translucent film. For example, a mixture liquid of ammonium cerium (IV) nitrate and perchloric acid and the like are preferable.

Further, in the process of the present invention, the following steps (e') and (f') may be carried out in place of the above-described steps (e) and (f).

In step (e'), the electron beam resist film is ashed so that it remains in a predetermined thickness in the first write area. The ashing of this step may be performed in the same manner as in step (e). However, the ashing is preferably performed so that the thickness of the electron beam resist film in the first write area is about 20% to about 60%, preferably 20% or more and 60% or less, more preferably 40% to 60%, of the thickness of the translucent film. More particularly, where the translucent film is a molybdenum silicide film having a thickness of about 90 nm to about 100 nm, the electron beam resist film is preferably about 18 nm to about 60 nm thick in the first write area after the ashing. By adjusting the thickness of the electron beam resist film in the first write area within this range, the electron beam resist film in the first write area can be completely removed by etching for patterning the translucent film in a later step.

In step (f'), using the patterned light-block film as a mask, the translucent film is patterned and simultaneously the electron beam resist film in the first write area is completely removed. The patterning in this step may be performed in the same manner as in step (f).

Lastly, the remaining electron beam resist film is removed. A liquid used for removal is preferably one to which the light-block film, the translucent film and the transparent substrate have sufficient resistance. For example, dimethylformamide, acetone, and a mixture of sulfuric acid and aqueous peroxide may be mentioned.

The present invention is now described in detail by way of an embodiment thereof.

FIGS. 1(a) to 1(g) are schematic sectional views illustrating an exemplary process for producing a halftone mask in accordance with the present invention. In the figures, there are shown a substrate 1 of quarts as a transparent substrate, a film 2 of molybdenum silicide as a translucent film, a film 3 of chromium as a light-block film, an electron beam (referred to as EB hereinafter) resist 4, a first write area 4a and a second write area 4b.

The process for producing a halftone mask of the present invention is now explained with reference to FIGS. 1(a) to 1(g).

First, the molybdenum silicide film 2 is formed to a thickness of 90 to 100 nm on the quartz substrate 1 by sputtering, by vacuum evaporation or the like, and the chromium film 3 is formed to a thickness of 60 to 70 nm thereon. Subsequently, the EB resist film 4 is formed of a thickness of 450 to 550 nm by applying (see FIG. 1(a)).

The resist film must exhibit a good resistance to etching when the molybdenum film 2 and the chromium film 3 are etched. In an EB writing process, EB is irradiated at a necessary dose (e.g., 1.4 and 1.4) which is so set that after development, a light-blocked area will remain unwritten, a translucent area will be an area (the first write area 4a) in which the thickness of the EB resist film will be half of the thickness in the unwritten area and a transparent area will be an area (the second write area 4b) in which the EB resist film will be completely removed. Resist films are generally classified into a positive and a negative type, and the resist film shown in the figures is an example of the positive type. In the case where the positive type resist film is used, a part of the EB resist film which is not exposed to EB remains as a resist pattern in the following developing step, and a part of the EB resist film which is exposed to EB is dissolved in a developing solution and exposes the chromium film 3 partially (see FIG. 1(b)).

After the development, the exposed chromium film 3 is dry-etched. The etching is carried out by a parallel plate reactive ion etching (RIE) method using an etching gas of $CCl_4$ (tetrachloromethane) and $O_2$ (oxygen), or $CH_2Cl_2$ (dichloromethane) and $O_2$ at a controlled flow rate of 25 sccm: 75 sccm. An RF power is 200W (500W or lower), pressure is 33.2 Pa, the distance between electrodes is 60 mm, and a discharge frequency is 13.56 MHz.

The etching rate of the chromium film 3 is 55 nm/min, and an etching selectivity ratio (etching rate ratio) of the chromium film 3 to the molybdenum silicide film 2 is 30 or more. The EB resist film 4 serves as a protective film for the chromium film 3 against etching. Accordingly the chromium film 3 is removed only where it is not covered with the EB resist film 4, and the molybdenum silicide film 2 is partially exposed there (see FIG. 1(c)). In the case where a chlorine-containing gas is used for dry-etching the chromium film 3, the EB resist film 4 exhibits a sufficient resistance to the dry etching. After the chromium film 3 is dry-etched, the EB resist film 4 in the first write area 4a is removed by ashing (see FIG. 1(d)).

This ashing is preferably performed so that the thickness of the EB resist film 4 in the first write area 4a is such that the EB resist film 4 in this area will be completely removed when the molybdenum silicide film 2 is being etched, that is, 20 to 50 nm. In other words, the thickness of the EB resist film 4 in the first write area 4a is preferably rendered 20 to 60% of the thickness of the underlying molybdenum silicide film 2. This is for maintaining the etching rate of the chromium film 3 which will be wet-etched later. However, the EB resist film 4 in the first write area 4a may be completely removed by the ashing at this time.

The ashing is performed by the parallel plate RIE method using an ashing gas of $O_2$ at a controlled flow rate of 100 sccm. The RF power is 150W (500W or lower), the pressure is 10 Pa, a magnetic field strength is 100G, the distance between electrodes is 60 mm and the discharge frequency is 13.56 MHz. The ashing rate of the EB resist film is 100 nm/min.

After the EB resist 4 in the first write area 4a is ashed, the molybdenum silicide film 2 is dry-etched with the chromium film 3 as a mask (see FIG. 1(e)). This etching is performed by the parallel plate RIE method using an etching gas of $CF_4$, $O_2$ and $N_2$ (nitrogen) at a controlled flow rate of 100 sccm: 5 sccm: 18 sccm. The RF power is 100W, the pressure is 2 Pa, the distance between electrodes is 60 mm, the magnetic field strength is 100G and the discharge frequency is 13.56 MHz.

After the molybdenum silicide film 2 is dry-etched, the exposed chromium film 3 is wet-etched using the remaining EB resist film as a mask. As an etchant, a mixture liquid of ammonium cerium (IV) nitrate and perchloric acid is used (see FIG. 1(f)).

After the chromium film 3 is wet-etched, the EB resist film 4 is stripped (see FIG. 1(g)). As strippers, dimethylformamide, acetone, and an aqueous solution of sulfuric acid and hydrogen peroxide are used. In this case, the transparent substrate 1, the molybdenum silicide film 2 and the chromium film 3 must have sufficient resistance to the strippers.

According to the present invention, the resist film in the first write area is removed by ashing before the molybdenum silicide is dry-etched. Thereby, the dry etching of the molybdenum silicide using the $CF_4+O_2+N_2$ plasma becomes independent of the ashing using the $O_2$ plasma. Thus, an ashing rate of 100 nm/min or more can be stably realized for removing the resist film in the first write area.

What is claimed is:

1. A process for producing a halftone mask comprising the steps of:

(a) forming an electron beam resist film on a mask blank which includes a translucent film and a light-block film sequentially formed on a transparent substrate;

(b) irradiating an electron beam to the electron beam resist film in such a dose that the electron beam resist film remains in a predetermined thickness by development in a first write area and is completely removed by development in a second write area;

(c) developing the electron beam resist film thereby to form an electron beam resist film retaining the predetermined thickness in the first write area and having an opening in the second write area;

(d) patterning the light-block film using the resulting electron beam resist film as a mask;

(e) ashing the electron beam resist film to remove the electron beam resist film from the first write area completely;

(f) patterning the translucent film using the patterned light-block film as a mask; and (g) patterning the light-block film using the resulting electron beam resist film as a mask.

2. A process according to claim 1, wherein the thickness of the electron beam resist film remaining in the first write area in step (c) is 20% or more and 80% or less of the initial thickness of the electron beam resist film.

3. A process according to claim 1, wherein the translucent film is a film of molybdenum silicide.

4. A process according to claim 1, wherein in step (f), the translucent film is patterned using a mixture gas of carbon fluoride, oxygen and nitrogen as an etching gas.

5. A process according to claim 1, wherein the electron beam resist film is used in a thickness of 450 nm to 550 nm, the electron beam is irradiated at a dose of 1.0 to 1.8 in a first write area and at a dose of 2.0 to 3.6 in a second write area.

6. A process for producing a halftone mask comprising the steps of:

(a) forming an electron beam resist film on a mask blank which includes a translucent film and a light-block film sequentially formed on a transparent substrate;

(b) irradiating an electron beam to the electron beam resist film in such a dose that the electron beam resist film remains in a predetermined thickness by development in a first write area and is completely removed by development in a second write area;

(c) developing the electron beam resist film to form an electron beam resist film retaining the predetermined thickness in the first write area and having an opening in the second write area;

(d) patterning the light-block film using the resulting electron beam resist film as a mask;

(e') ashing the electron beam resist film so that the electron beam resist film remains in a predetermined thickness in the first write area, this predetermined thickness being smaller than said predetermined thickness in (b);

(f') patterning the translucent film and simultaneously removing the electron beam resist film from the first write area, using the patterned light-block film as a mask; and (g) patterning the light-block film using the resulting electron beam resist film as a mask.

7. A process according to claim 6, wherein in step (e'), the thickness of the electron beam resist film remaining in the first write area after ashing is 20% or more and 60% or less of the thickness of the translucent film.

8. A process according to claim 6, wherein the translucent film is a film of molybdenum silicide.

9. A process according to claim 6, wherein in step (f'), the translucent film is patterned using a mixture gas of carbon fluoride, oxygen and nitrogen as an etching gas.

10. A process according to claim 6, wherein in step (c), the thickness of the electron beam resist film remaining in the first write area is 20% or more and 80% or less of the initial thickness of the electron beam resist film.

11. A process according to claim 6, wherein the electron beam resist film is used in a thickness of 450 nm to 550 nm, the electron beam is irradiated at a dose of 1.0 to 1.8 in a first write area and at a dose of 2.0 to 3.6 in a second write area.

* * * * *